(12) United States Patent
Mai

(10) Patent No.: US 6,210,480 B1
(45) Date of Patent: Apr. 3, 2001

(54) DEVICE FOR WET COATING, IN PARTICULAR PRINTED CIRCUIT BOARDS, WITH LACQUER

(75) Inventor: Josef Mai, Horb (DE)

(73) Assignee: Robert Bürkle GmbH, Freudenstadt (DE)

( * ) Notice: Subject to any disclaimer, the term of this patent is extended or adjusted under 35 U.S.C. 154(b) by 0 days.

(21) Appl. No.: 09/214,515

(22) PCT Filed: Jul. 3, 1997

(86) PCT No.: PCT/DE97/01414

§ 371 Date: Jan. 7, 1999

§ 102(e) Date: Jan. 7, 1999

(87) PCT Pub. No.: WO98/02252

PCT Pub. Date: Jan. 22, 1998

(30) Foreign Application Priority Data

Jul. 11, 1996 (DE) .......................................... 296 12 952 U

(51) Int. Cl.[7] ...................................................... B05C 1/02
(52) U.S. Cl. ........................ 118/262; 118/104; 118/203; 118/249
(58) Field of Search ................................... 118/104, 203, 118/70, 204, 102, 262, 249; 427/356, 428; 15/256.5, 256.51, 256.53

(56) References Cited

U.S. PATENT DOCUMENTS

| | | |
|---|---|---|
| 2,102,984 | 12/1937 | Von Hofe . |
| 2,593,074 | 4/1952 | Trist . |
| 3,568,636 | 3/1971 | Lockwood . |
| 3,995,585 | * 12/1976 | Schuurmans ........................... 118/204 |
| 4,135,475 | * 1/1979 | Bomers ................................ 118/262 |
| 5,518,573 | 5/1996 | Schulz . |

FOREIGN PATENT DOCUMENTS

| | | |
|---|---|---|
| 32 18417 | 1/1983 | (DE) . |
| 85 03 321 | 5/1985 | (DE) . |
| 3621 417 | 8/1987 | (DE) . |
| 42 04 403 | 9/1993 | (DE) . |
| 44 17 518 | 7/1995 | (DE) . |
| 83/01636 | 5/1983 | (WO) . |

OTHER PUBLICATIONS

Patent Abstracts of Japan, vol. 6, No. 129 (P–128), Jul. 15, 1982 for JP 57 053776 A (Ricoh Co. Ltd.), Mar. 30, 1982, Recleaning Device of Copying Machine.

Patent Abstracts of Japan, vol. 7, No. 038 (P–176), Feb. 16, 1983 for JP 57 191672 (Canon KK), Nov. 25, 1982, Blade Type Cleaning Device on Surface of Image Holding Member of Picture Forming Device.

* cited by examiner

Primary Examiner—Laura Edwards
(74) Attorney, Agent, or Firm—Browdy and Neimark

(57) ABSTRACT

A device for wet coating, in particular printed circuit boards, with lacquer using at least one applicator roller (20, 21) and sparing at least one edge area of the printed circuit boards. The device uses a doctor blade arrangement situated between a lacquer reservoir and the printed circuit board that can move in an axial direction, one edge of which touches the applicator roller (20, 21). The doctor blade arrangement is designed can also remove excess lacquer, for example, photo-resistant lacquer from a multilayer board, from both longitudinal edges of the printed circuit board without any residue. This is also possible for multilayer boards of varying widths in particular. By laterally displacing the lacquer from the respective peripheral edges of both applicator rollers (20, 21) that are to kept free of lacquer, this lacquer is directly fed back into a lacquer reservoir via the outer edge area of the pertaining applicator roller without leading to an accumulation of lacquer, dirtying and breaking-down of the machine.

11 Claims, 3 Drawing Sheets

DEVICE FOR WET COATING, IN PARTICULAR PRINTED CIRCUIT BOARDS, WITH LACQUER

This application is the national phase of international application PCT/DE97/01414 filed Jul. 3, 1997 which designated the U.S.

BACKGROUND OF THE INVENTION

1. Technical Field

The invention relates to a device for wet coating, in particular printed circuit boards, with lacquer by means of at least one application roller, leaving at least one edge area of the printed circuit board free and employing a doctor blade arrangement.

2. Prior Art

Such an arrangement is known from DE-GM 85 03 321, it is essentially used to obtain a lacquer-free gripping edge in multi-layer printed circuit boards which are coated on one or both sides, in particular with variable coating widths, in the course of a rolling method. A more detailed description of this problem can also be found in DE-PS 44 17 518.

The doctor blade arrangement in accordance with the first-mentioned utility model consists of two independent strippers, which leave the problem of what to do with the lacquer stripped off in the area of the circumference of the roller. If no reasonable solution is provided for this, this known solution can lead to accumulations of lacquer at undesired places, soiling, and interference with the operation of the entire device.

BRIEF SUMMARY OF THE INVENTION

The essential object of the invention therefore is to further develop such doctor blade arrangements in such a way that they can be adapted to modern roller designs (cyclical processes) and permit the controlled displacement of the lacquer from the circumferential area of the application roller.

DETAILED DESCRIPTION OF THE INVENTION

Figure 1:
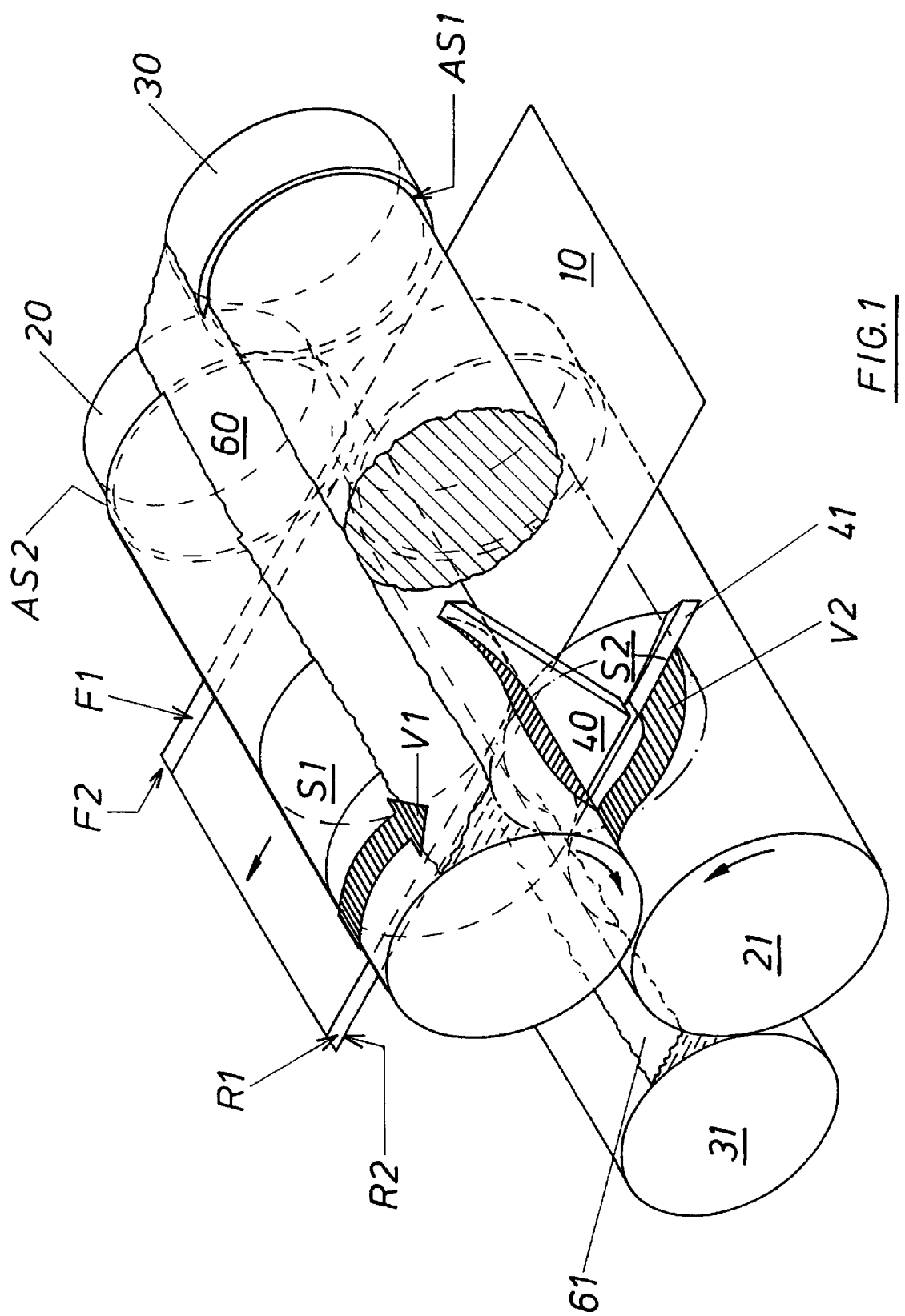
FIG. 1 is a perspective view of a preferred embodiment of a device in accordance with the invention.

The attainment of the object in accordance with the invention can be found in a first embodiment by means of a perspective basic representation in FIG. 1:

In a known manner, the multi-layer board 10 to be coated is passed between two application rollers 20 and 21, which are arranged one above the other and rotate in opposite directions, or is respectively taken along by them, so that the photo-resist lacquer, for example, which adheres there is, evenly distributed from the circumference of the application roller 20, 21 to the multi-layer board 10. In this connection it is known to leave a first edge F1/F2 of the printed circuit board 10 free of the coating in that the application roller 20 and the metering roller 30 cooperate in this area (on the right in FIG. 1) in such a way that coating of this edge F1 by the upper application roller 20, and of the lower edge F2 by the lower application roller 21 is prevented. This is without problems regarding any formats of printed circuit boards, since the edge of the printed circuit board 10, which is on the right in FIG. 1, can always be appropriately aligned.

However, with printed circuit boards of varying width the upper edge R1, or respectively the lower edge R2 on the opposite longitudinal side of the printed circuit board 10, takes up a changing relative position in respect to the circumference of the application roller 20, 21, so that it is necessary here to free a circumferential area S1, S2 of the application rollers 20, 21 from applied lacquer, whose axial position on the application rollers 20, 21 can be variably set.

The doctor blade arrangement 40 has only been represented in principle in FIG. 1, these are two strippers which are placed wedge-like in respect to each other and have curved stripping edges 45, 46 (FIG. 3), forming an angle in the range of 40° to 50° in respect to each other. Here, the radius of the curved stripping edge 45, 46 is of such a dimension that, in the relative positioning of the stripper 40, 41 represented in FIG. 1, it rests, or respectively can be placed, against the circumference of the application rollers 20, 21.

A first, upper lacquer reservoir 60 is located between the upper application roller and the upper metering roller, and correspondingly a second, lower lacquer reservoir 61 between the lower application roller 21 and the lower metering roller 31. The metering rollers 30 and 31 can be adjusted in relation to the application rollers 20, 21 in such a way that a variable roller gap is formed, by means of which the thickness of the lacquer application on the multi-layer board 10 can be defined.

The relative arrangement of the two strippers 40, 41, which are inclined wedge-shaped in respect to each other, on the one hand and, on the other, in respect to the application rollers 20, 21, and the arrangement of the lacquer reservoirs 60, 61 now has been selected to be such that, when the device is operated, i.e. when the application rollers 20, 21 rotate in the direction of the arrow, the lacquer from the lacquer reservoir which has already been applied is laterally pushed away in a circumferential area S1 on the upper application roller 20, or respectively S2 on the lower application roller 21, which is intended to be shown by the non-cross-hatched circumferential areas of the application rollers 20, 21 in FIG. 1. A lacquer flow V1, or respectively V2, results from this lateral displacement of the lacquer, which is represented by the arrows in FIG. 1 and FIG. 2. In this case it is of essential importance that the excess lacquer from the circumferential areas S1, S2, which are to be made lacquer-free, is directly returned via the outer edge areas of the associated application roller to one of the two lacquer reservoirs 60, 61.

By displacing the doctor blade arrangement, consisting of the strippers 40 and 41, in the direction of the longitudinal axes of the rollers, the relative position of the stripped-of circumferential area S1, S2 can be defined in a simple manner in such a way, that the desired lacquer-free upper edge R1, or respectively lower edge R2, is created on the multi-layer board 10.

Figure 2:
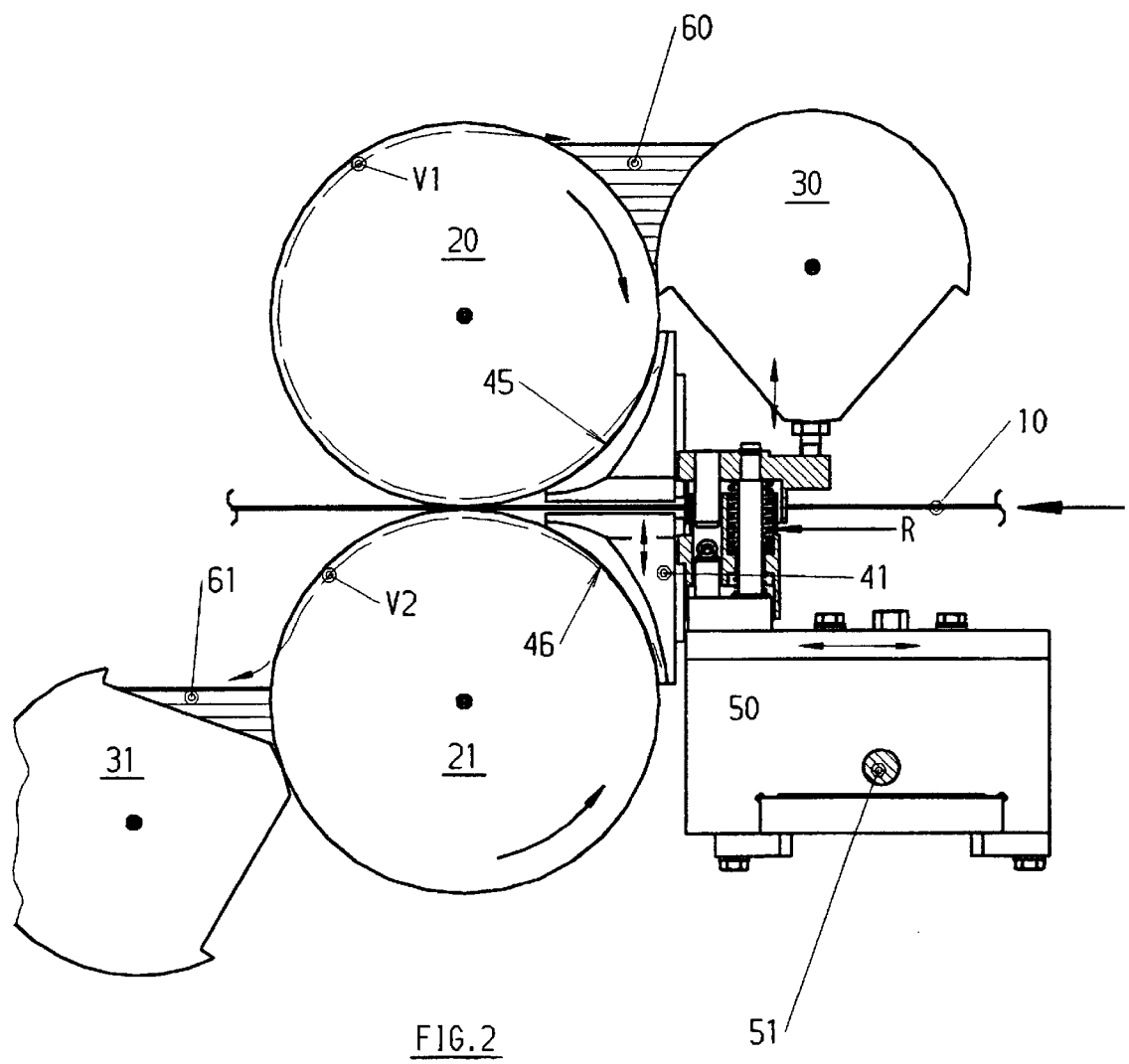
FIG. 2 is a side elevational view, partly in cross section of the embodiment shown in FIG. 2.
Figure 3:
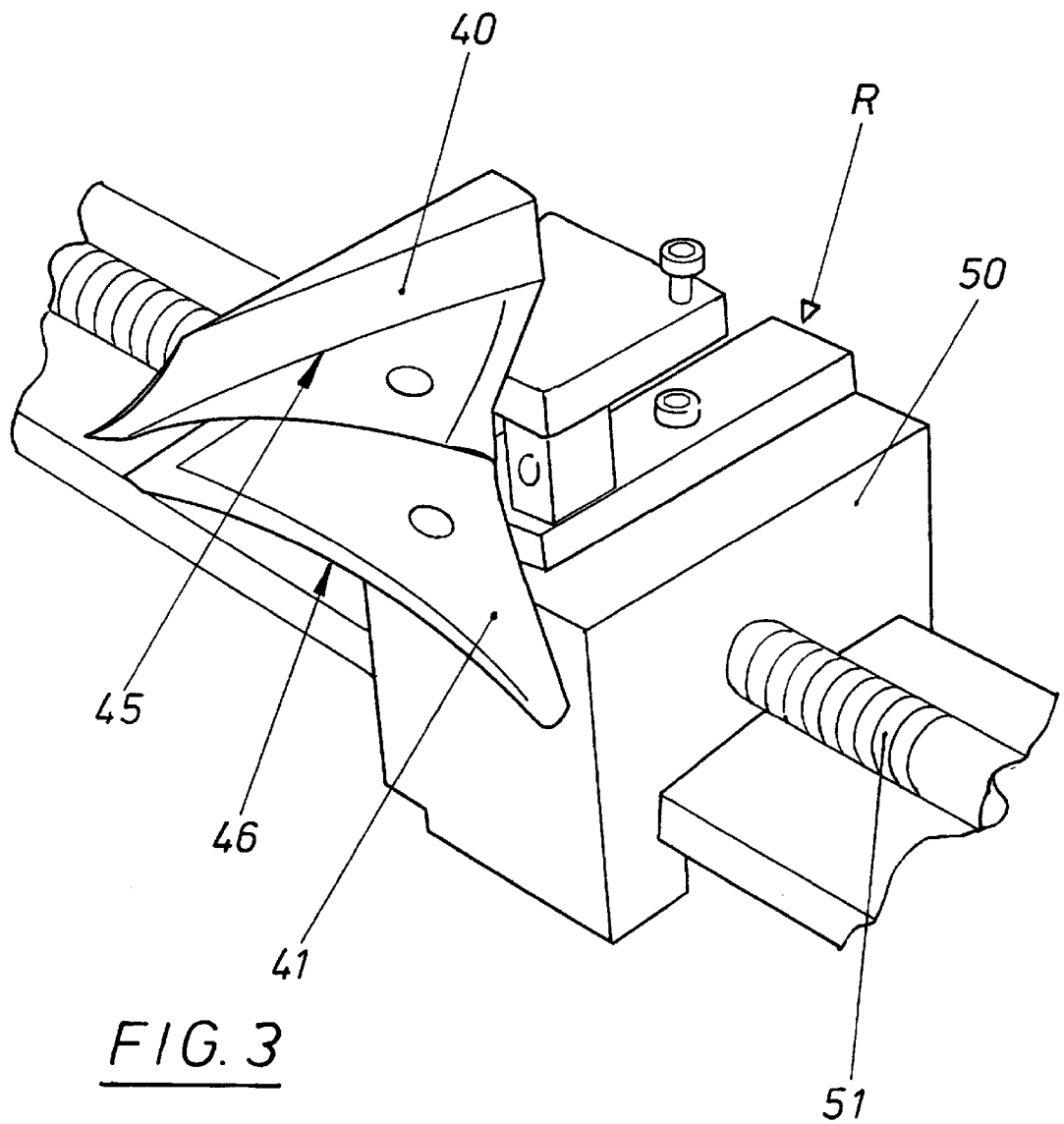
FIG. 3 is a perspective, detail view of components of the embodiment shown in FIGS. 1 and 2.

The structural embodiment as a part of the doctor blade arrangement R of the strippers 40, 41, which have been only schematically represented in FIG. 1 for better understanding, is shown in greater detail in FIGS. 2 and 3.

Both strippers 40 and 41 are seated on a common guide block 50, which can be displaced by means of a spindle drive 51, by means of this the above mentioned axial displacement and therefore the definition of the stripped-off circumferential area S1, S2 on the application rollers is provided. Here, the doctor blade suspension has been made resilient so that, even with an application roller moved upward in a cyclical manner, the strippers 40, 41 always remain in contact in order to immediately achieve a lacquer-free edge at the start of the multi-layer board 10. The strippers 40, 41 can be rapidly changed for cleaning, even if strippers must be used which are correspondingly adapted to the reduced roller diameter occurring when the application rollers are re-ground.

The strippers are centered and adjusted on the work side of the guide block 50. During the cyclical movement, the upper stripper 40 is pushed downward by the upper metering roller 30 and thereby creates the required contact pressure on the lower application roller 21. In order not to transfer these pressure forces to the spindle drive 51, the upper stripper 40 is resiliently seated on the guide block 50, as already mentioned above.

The fine adjustment of the strippers can be accomplished by means of screws.

The fixed-in-place metering rollers 30, 31 in the sectional view in FIG. 2 have been provided with different cross sections, which brings about two advantages:

First, a drip edge is created, so that no cleaning agent can run down along the shell of the metering rollers during cleaning and result in soiling, furthermore, an enlargement of the lower lacquer reservoir 61 is achieved by means of the positioning of the lower metering roller 31, which is advantageous during continuous operation.

What is claimed is:

1. A device for wet coating a board with lacquer, said device comprising: at least one application roller for wet coating the board when the board is disposed in a coating plane, the application roller having a circumference and being rotatable about an axis; at least one metering roller that cooperates with the at least one application roller; and a doctor blade arrangement which acts on the application roller over a portion of the circumference of the application roller and can displace parallel to the axis in order to leave at least one edge area of the board free of lacquer, the doctor blade arrangement being located between a lacquer reservoir and the board for removing applied lacquer along a portion of the circumference of the application roller, which portion has a variable width, and lacquer reservoir being located between the application roller and the metering roller, wherein the doctor blade arrangement comprises at least one stripper with a curved stripping edge from which excess lacquer stripped off along the portion of the circumference of the application roller is directly returned via an outer edge area of the associated application roller back to the lacquer reservoir.

2. The device in accordance with claim 1, wherein, for wet coating both sides of the board, there are two application rollers and two metering rollers each associated with a respective application roller, and further wherein the doctor blade arrangement comprises two strippers which are essentially maintained symmetrically in respect to the coating plane, are arranged in a wedge shape in respect to each other and each act on a respective application roller.

3. The device in accordance with claim 2, wherein the doctor blade arrangement further comprises a common guide block on which the strippers are fastened, and said device further comprises a spindle drive supporting the common guide block for movement parallel to the coating plane.

4. The device in accordance with claim 3, wherein the doctor blade arrangement is displaceable radially with respect to the application rollers and is displaceable against the application rollers in such a way that a stripped-off portion of the circumference of each application roller results in a lacquer-free edge area of a desired width of the coated board.

5. The device in accordance with claim 3, wherein the strippers are resiliently maintained on the guide block.

6. The device in accordance with claim 2, wherein the application rollers are arranged vertically one above the other, the associated metering rollers are fixed in place, and each metering roller is offset laterally from a respective application roller and defines, together with the respective application roller, a respective lacquer reservoir.

7. The device in accordance with claim 2, wherein there are two metering rollers each having a cross section constriction that forms a drip edge.

8. The device in accordance with claim 1, wherein the doctor blade arrangement is displaceable radially with respect to the application roller.

9. The device in accordance with claim 1, wherein the application roller and the associated metering roller have respective meshing shoulders for generating a fixed, coating-free edge on the board.

10. The device in accordance with claim 1, wherein the board is a circuit board.

11. The device in accordance with claim 1, wherein the board is a multi-layer circuit board.

* * * * *